United States Patent
Huang

(10) Patent No.: US 10,102,783 B2
(45) Date of Patent: Oct. 16, 2018

(54) ARRAY SUBSTRATE AND DETECTING METHOD FOR AN ARRAY SUBSTRATE

(71) Applicants: BOE Technology Group Co., Ltd., Beijing (CN); Beijing BOE Display Technology Co., Ltd., Beijing (CN)

(72) Inventor: Xiaoping Huang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 297 days.

(21) Appl. No.: 14/806,779

(22) Filed: Jul. 23, 2015

(65) Prior Publication Data

US 2016/0163244 A1 Jun. 9, 2016

(30) Foreign Application Priority Data

Dec. 9, 2014 (CN) .......................... 2014 1 0748651

(51) Int. Cl.
*G01R 31/26* (2014.01)
*G09G 3/00* (2006.01)
*H01L 27/12* (2006.01)
*G09G 3/36* (2006.01)

(52) U.S. Cl.
CPC ........... *G09G 3/006* (2013.01); *G09G 3/3685* (2013.01); *H01L 27/124* (2013.01); *G09G 2330/08* (2013.01)

(58) Field of Classification Search
CPC .......... G01R 19/16519; G01R 31/2621; G01R 31/2635; G09G 3/3241; G09G 3/325; G09G 2330/12; G09G 3/006; G09G 3/3233; H04N 9/3191
See application file for complete search history.

(56) References Cited

U.S. PATENT DOCUMENTS

| 2010/0066383 A1* | 3/2010 | Chung | G02F 1/1309 324/512 |
| 2015/0054165 A1* | 2/2015 | Won | H01L 27/124 257/773 |
| 2016/0163244 A1* | 6/2016 | Huang | G09G 3/006 324/760.02 |

FOREIGN PATENT DOCUMENTS

CN 102116950 A 7/2011

OTHER PUBLICATIONS

Jan. 17, 2017—(CN) Second Office Action Appn 201410748651.9 with English Tran.

* cited by examiner

*Primary Examiner* — Tung X Nguyen
(74) *Attorney, Agent, or Firm* — Banner & Witcoff, Ltd.

(57) ABSTRACT

Embodiments of the invention provide an array substrate and a detecting method for an array substrate. The array substrate comprises a plurality of signal lines and a repairing line intersecting with and isolated from the signal lines. The detecting method comprises applying a first detection signal to the plurality of signal lines; and applying a second detection signal different from the first detection signal to the repairing line, in the case that the first detection signal is applied to the plurality of signal lines.

19 Claims, 2 Drawing Sheets

```
applying a first detection signal to a plurality of signal lines
```

```
applying a second detection signal different from the first
detection signal to a repairing line in a case that the plurality
of signal lines are applied with the first detection signal
```

ARRAY SUBSTRATE AND DETECTING METHOD FOR AN ARRAY SUBSTRATE

This application claims priority to Chinese Patent Application No. 201410748651.9 filed on Dec. 9, 2014. The present application claims priority to and the benefit of the above-identified application and is incorporated herein in its entirety.

TECHNICAL FIELD

Embodiments of the invention relate to an array substrate and a detecting method for an array substrate.

BACKGROUND

In a manufacturing process of a Thin Film Transistor Liquid Crystal Display (TFT-LCD), in order to avoid failure of a display panel due to damage to data lines, repairing lines intersecting with the data lines are formed on an array substrate.

SUMMARY

An embodiment of the invention provides a detecting method for an array substrate comprising a plurality of signal lines and a repairing line intersecting with and isolated from the signal lines, the detecting method comprising: applying a first detection signal to the plurality of signal lines; and applying a second detection signal different from the first detection signal to the repairing line, in the case that the first detection signal is applied to the plurality of signal lines.

An embodiment of the invention provides an array substrate comprising a plurality of signal lines and a repairing line intersecting with and isolated from the signal lines, a switch element and a signal providing terminal, wherein the switch element has an input terminal in electrical connection with the signal providing terminal, an output terminal in electrical connection with the repairing line and a control terminal in electrical connection with the plurality of signal lines.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

The technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In a production process of a liquid crystal panel, an Electro-Static Discharge (ESD) is apt to occur at intersection of a repairing line and a signal line, which results in short circuit between the repairing line and the signal line at the intersection.

Figures 1, 2:
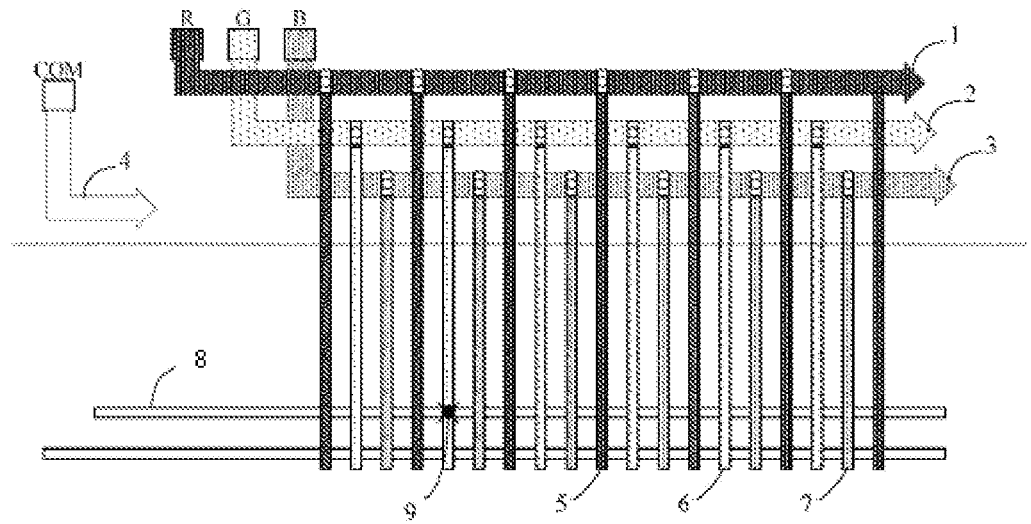
FIG. 1 is a structural schematic diagram of an array substrate for implementing a detecting method in related art.
FIG. 2 is a flow diagram of a detecting method provided by an embodiment of the invention.

In an Array & Cell Test process, a shorting bar detecting method is usually adopted. As shown in FIG. 1, a common electrode line 4 and three shorting bars corresponding to red sub pixels, green sub pixels and blue sub pixels respectively (namely, a red shorting bar 1, a green shorting bar 2 and a blue shorting bar 3) are formed on an array substrate, wherein, each shorting bar is connected with data lines 5, 6 or 7 connected with corresponding sub pixels (the red sub pixels, green sub pixels and blue sub pixels). By applying voltages to the shorting bars respectively, it can be detected whether the data lines connected with the shorting bars are damaged.

In order to avoid failure of a display panel caused by damage to the data lines, repairing lines 8 intersecting with and insulating from the data lines are formed on a peripheral region of the array substrate. Hoverer, the inventor found that: in the production process of the liquid crystal panel, ESD is apt to occur at intersections of the repairing lines 8 and data lines (reference sign 9 in FIG. 1 is a position where ESD occurs), which results in breakdown of an insulating layer at the intersections and short circuit between the data line and repairing line 8, causing poor display. When the data lines on the array substrate are detected by the shorting bar detecting method, voltages provided for respective data lines are, for example, positive constant voltage signals, while the repairing lines 8 are not connected with any signal resource or grounded, and thus have no voltage thereon, in other words, their voltages are zero. Therefore, when the signal line and the repairing line 8 are short-connected at the intersection indicated by 9 in FIG. 1, the repairing line 8 basically do not influence or slightly draw back the voltage of the data line short-connected with the repairing line. In other words, a pixel voltage of sub pixels corresponding to the data line in short circuit connection with the repairing line 8 is slightly different from a pixel voltage of sub pixels corresponding to a data line not in short circuit connection with the repairing line 8, so difference of liquid crystal deflection is not obvious, and difference of displayed colors is not obvious either, so it is not easy to detect such a short circuit in the Array & Cell Test process.

However, in a module phase, a full contact detecting method is adopted, wherein the respective data lines are not mutually electrically connected. In a case that the repairing line 8 and a certain data line are short-connected, the voltage of the data line is drawn down so that the liquid crystal deflection in this region is different from that in a normal region, and two lines are shown in detection. At this time, it is detected that the data line has a fault, and the whole panel is failed if the fault is severe, and an extra repair process is required even if the fault is not severe.

An embodiment of the invention provides an array substrate and a failure detecting method for an array substrate, which can detect a short circuit failure between the signal line and the repairing line in the Array & Cell Test process.

As shown in FIG. 2, the detecting method for the array substrate provided by the embodiment of the invention, for example, comprises: applying a first detection signal to a plurality of signal lines; and applying a second detection signal different from the first detection signal to a repairing line in a case that the plurality of signal lines are applied with the first detection signal.

Figure 3:
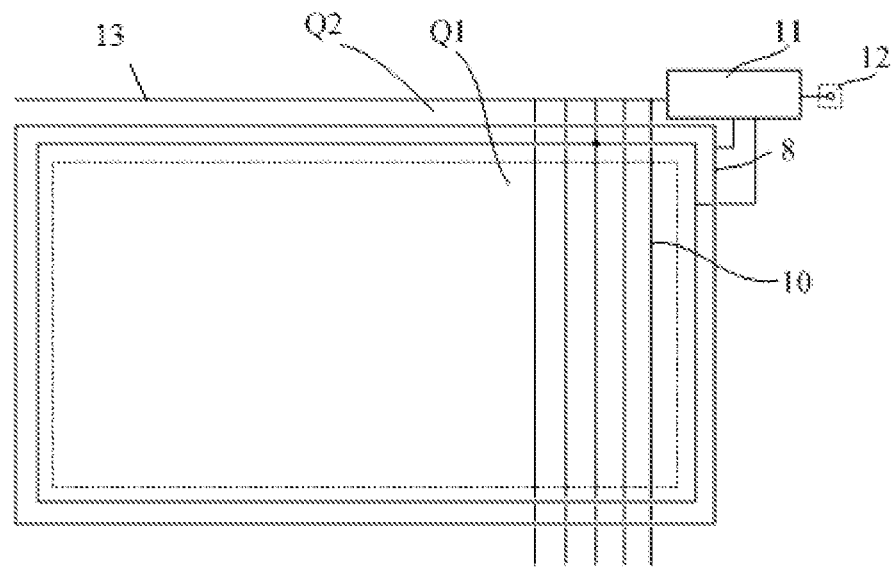
FIG. 3 is a structural schematic diagram showing an array substrate for implementing the detecting method provided by the embodiment of the invention.

The detecting method for the array substrate provided by the embodiment of the invention is, for example, implemented on an array substrate as shown in FIG. 3. The array substrate includes signal lines 10, repairing lines 8 intersecting with and isolated from the signal lines 10, a detecting line 13 connecting with the respective signal lines 10, a switch element 11 and a signal providing terminal 12. The repairing lines 8 are configured to repair the signal lines 10 in a case that one of the signal lines 10 is damaged. Herein, the signal lines 10 can be data lines or gate lines. In the embodiment, the signal lines 10 are, for example, data lines. The array substrate is, for example, used for forming a liquid crystal display device.

The array substrate can includes a display region Q1 (a region enclosed by a dotted line in FIG. 3) and a peripheral region Q2 surrounding the display region Q1, wherein the repairing lines 8 can be arranged in the peripheral region Q2 of the array substrate in order not to affect an aperture ratio of the array substrate.

It is noted that, in the present embodiment, short circuit connection between the signal lines 10 and the repairing lines 8 can be detected when using a shorting bar detecting method.

The detecting method for the array substrate provided by the embodiment comprises: applying a first detection signal to respective signal lines 10; and applying a second detection signal different from the first signal for the repairing lines 8 in a case that the signal lines 10 are applied with the first detection signal. In the embodiment, the signal providing terminal 12 is used for providing the second detection signal. When short circuit connection occurs between the signal lines 10 and the repairing lines 8 due to ESD, the switch element 11 can introduce the second detection signal provided by the signal providing terminal 12 into the repairing lines 8, to draw up or down a voltage of this signal line 10 in short circuit connection with the repairing line 8. Therefore, the voltage of this signal line 10 and that of other signal lines are obvious different, that is to say, a display of pixel units corresponding to this signal line 10 will be obviously different from a display of pixel units corresponding to the other signal lines 10. It can be judged out which signal line 10 is in short circuit connection with the repairing line 8. The repairing line 8 on both sides of the short circuit position can be cut off so as to prevent the voltage of the signal line 10 from being drawn down by the repairing line 8, and meanwhile, the difficulty in detecting the short circuit connection between the signal lines 10 and the repairing lines 8 due to ESD is solved.

In FIG. 3, the plurality of signal lines 10 for example, are connected to red sub pixels (not shown in FIG. 3) respectively, and the signal lines 10 are connected to the same detecting line 13 at one end. The detecting line 13 and the repairing lines 8 are electrically connected with the switch element 11. The switch element 11 is configured to introduce the second detection signal provided by the signal providing terminal 12 into the repairing lines 8 under control of the signal lines 10.

Figure 4:
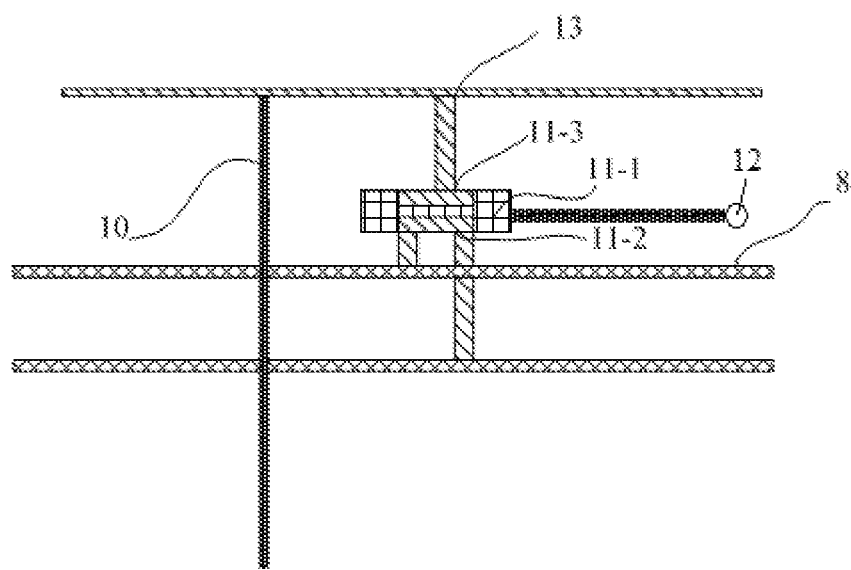
FIG. 4 shows a connection manner of respective terminals of the switch element in FIG. 3 with a detecting line, a repairing line and a signal line.

For example, with reference to FIG. 4, the switch element 11 has an input terminal 11-1, an output terminal 11-2 and a control terminal 11-3. The control terminal 11-3 of the switch element 11 is connected to the signal lines 10 via the detecting line 13; the input terminal 11-1 of the switch element 11 is connected to the signal providing terminal 12; and the output terminal 11-2 of the switch element 11 is connected to the repairing lines 8. In other words, the signal lines 10 are connected with the control terminal of the switch element 11, and the first detection signal (for example, a voltage signal) applied to the signal lines 10 can serve as a control signal of the switch element 11 to control the switching on and off of the switch element. For example, when the signal lines 10 are applied with the first detection signal (for example, the voltage signal), the switching element 11 is turned on, and the second detection signal (for example, the voltage signal) provided by the signal providing terminal 12 can applied to the repairing lines 8 via the switch element. In this way, once a certain signal line 10 and the repairing lines 8 are short-circuit connected, the second detection signal on the repairing lines 8 is also applied to the signal line 10, therefore, the voltage on the signal line 10 is drawn up or down. So it can be judged which signal line 10 is in short circuit connection with the repairing lines 8.

Further, the switch element is, for example, a switch transistor. For example, the switch transistor is a bipolar transistor or a field effect transistor.

In the embodiment, the switch element 11 is, for example, a thin film field effect transistor formed on the array substrate; the control terminal 11-3 (for example a gate electrode) of the switch transistor is connected to the signal lines 10, the input terminal 11-1 (for example a source electrode) of the switch transistor is connected with the signal providing terminal 12, and the output terminal 11-2 (for example a drain electrode) of the switch transistor is connected with the repairing lines 8. The switch transistor is used as the switch element because it is simple in structure and easy to control. Particularly, as respective sub pixel units in the display region Q1 of the array substrate include the switch transistors as well, the switch transistor 11 and those switch transistors in the respective sub pixel units can be formed by one patterning process, so the process time is saved, and the production efficiency is improved. For example, the control terminal 11-3 of the switch transistor is connected with the signal lines 10, so the first voltage signal applied to the signal lines 10 serves as a turn-on signal of the switch transistor. When the switch transistor is turned on, a second voltage signal provided by the signal providing terminal 12 can be introduced into the repairing lines 8 by the switch transistor. In this case, once a signal line 10 and the repairing lines 8 are short-circuit connected, a power source voltage on the repairing lines 8 can be applied to the signal line 10 to draw up or down the voltage of the signal line 10. Therefore, it can be judged which signal line 10 is in short circuit connection with the repairing lines 8.

When the switch element 11 is a switch transistor, a connection manner of respective terminals of the switch element with the detecting line 13, the repairing lines 8 and the signal lines 10 is as shown in FIG. 3. The input terminal 11-1 of the switch transistor is connected to the signal providing terminal 12, the output terminal 11-2 of the switch transistor is connected to the repairing lines 8, and the control terminal 11-3 of the switch transistor is connected to the signal lines 10 via the detecting line 13.

In the embodiment as shown in FIG. 2, the repairing lines 8 are in an annular shape and the number of the repairing lines 8 is two. In other embodiments, the number of the repairing lines 8 can be set as one or other number according to an estimated failure ratio of the signal lines.

In the embodiment, the first detection signal and the second detection signal are both constant voltage signals, or, the first detection signal and the second detection signal are both constant current signals. For example, the first detection signal applied to the signal lines 10 is a positive voltage signal, and the second detection voltage signal provided by the signal providing terminal 12 is a negative voltage signal. In this case, when the repairing lines 8 and the signal line 10 are short-circuit connected, as the second detection signal provided by the signal providing terminal 12 is a negative voltage signal, the voltage of the signal line 10 in short-circuit connection with the repairing lines 8 is drawn down, and it is very easy to detect which signal line 10 is in short circuit connection with the repairing lines 8. For example, a voltage value of the second detection voltage signal provided by the signal providing terminal is −20 V. In the case that the signal lines 10 are data lines, the voltage applied to the data lines is for example 15 V; In this case, if a certain data line 10 and a repairing lines 8 are short-circuit connected due to ESD, the voltage on the data line is drawn down to a negative value, so it is very easy to detect the data line 10 in short circuit connection with the repairing line 8.

It is noted that the second detection voltage signal provided by the signal providing terminal 12 can also be a positive voltage signal, as long as the voltage on the signal line 10 in short circuit connection with the repairing line 8 can be drawn to be obviously different from the voltage on other signal lines by the second detection voltage. For example, when an absolute value of a difference value between the first detection signal provided to the signal lines 10 and the second detection signal provided to the repairing lines is greater than or equal to 20% of an absolute vale of the first detection signal, it can be directly observed by using a related detecting instrument that the voltage of the signal line 10 in short circuit connection with the repairing lines 8 is obvious different from the voltage of other signal lines.

Hereinabove, the technical solution of the embodiment of the invention is explained based on the example that the signal lines 10 are data lines. It should be understood that the technical solution of the embodiment of the invention can also be used for detecting the short circuit connection between the signal lines 10 and the repairing lines 8 in the case that the signal lines 10 are gate lines. Here, the data lines are connected with the source electrodes of the thin film transistors in sub pixel units, and the gate lines are connected with the gate electrodes of the thin film transistors in the sub pixel units. The data lines and the gate lines define a plurality of sub pixel units.

In addition, although the second detection signal provided by the signal providing terminal 12 is introduced into the repairing lines 8 by the switch element 11 in the above embodiments, the signal providing terminal 12 can be directly connected with the repairing lines 8 in other embodiments.

In order to further improve the aperture ratio of the array substrate, for example, the switch element 11 and the signal providing terminal 12 are both arranged in the peripheral region Q2 of the array substrate.

It should be noted that after the failure detection of the signal lines 10 on the array substrate in the Array & Cell Test phase, the switch element 11 and the signal providing terminal 12 can be cut off from the repairing lines 8 and the signal lines 10 so as to prevent the subsequent signals on the signal lines 10 from flowing to the signal providing terminal 12 and causing failure of the array substrate.

The array substrate detected by the detecting method provided by the embodiments of the invention can be used for forming a display device. The display device can be any product or part having a display function, such as mobile phone, a tablet computer, a television, a monitor, a laptop, a digital photo frame and a navigator. The display device can be a liquid crystal display device, an OLED display device and the like.

Although the embodiments of the invention are described in detail by general description and specific examples above, certain modifications and improvements can be made based on the embodiments of the invention, which are obvious for those skilled in the art. Therefore, the modifications and improvements made without departing from the spirit of the embodiments of the invention fall in the protection scope of the invention.

According to the above description, the embodiments according to the present disclosure at least can provide structures and methods as follows:

(1). A detecting method for an array substrate comprising a plurality of signal lines and a repairing line intersecting with and isolated from the signal lines, the detecting method comprising:

applying a first detection signal to the plurality of signal lines; and applying a second detection signal different from the first detection signal to the repairing line, in the case that the first detection signal is applied to the plurality of signal lines.

(2). The detecting method according to (2), wherein, the first detection signal and the second detection signal are both constant voltage signals, or the first detection signal and the second detection signal are both constant current signals.

(3). The detecting method according to (1) or (2), wherein, an absolute value of a difference value of the first detection signal and the second detection signal is greater than or equal to 20% of an absolute value of the first detection signal.

(4). The detecting method according to any one of (1) to (3), further comprising: providing a switch element, such that the second detection signal is applied to the repairing line under control of the switch element.

(5). The detecting method according to (4), wherein, the switch element is a switch transistor comprising a control terminal, an input terminal and an output terminal; the control terminal of the switch transistor is electrically connected to the signal line, and the output terminal of the switch transistor is electrically connected to the repairing line, such that the second detection signal is applied to the repairing line through the input terminal of the switch transistor.

(6). The detecting method according to (5), wherein, the switch transistor is a bipolar transistor or a field effect transistor.

(7). The detecting method according to (6), wherein, the switch transistor is a thin film field effect transistor formed on the array substrate.

(8). The detecting method according to any one of (1) to (7), wherein, the signal lines are data lines or gate lines.

(9). The detecting method according to (4), wherein, the array substrate includes a display region for displaying and a peripheral region surrounding the display region, and the switch element is arranged in the peripheral region of the array substrate.

(10). The detecting method according to any one of (1) to (9), wherein, the array substrate includes a display region for displaying and a peripheral region surrounding the display region, and the repairing line is arranged in the peripheral region of the array substrate.

(11). The detecting method according to (10), wherein, the repairing line has an annular shape.

(12). The detecting method according to any one of (1) to (11), wherein, the first detection signal and the second detection signal are constant voltage signals opposite in polarity.

(13). The detecting method according to (12), wherein, the first detection signal is 15 V, and the second detection signal is −20 V.

(14). An array substrate comprising a plurality of signal lines and a repairing line intersecting with and isolated from the signal lines, a switch element and a signal providing terminal, wherein the switch element has an input terminal in electrical connection with the signal providing terminal, an output terminal in electrical connection with the repairing line and a control terminal in electrical connection with the plurality of signal lines.

(15). The array substrate according to (14), wherein, the switch element is a bipolar transistor or a field effect transistor.

(16). The array substrate according to (14), wherein, the switch element is a thin film field effect transistor formed on the array substrate.

(17). The array substrate according to any one of (14) to (16), wherein, the signal lines are data lines or gate lines.

(18). The array substrate according to any one of (14) to (17), wherein, the array substrate includes a display region for displaying and a peripheral region surrounding the display region, and the switch element and the repairing line are arranged in the peripheral region of the array substrate.

(19). The array substrate according to (18), wherein, the repairing line has an annular shape.

The application claims priority of Chinese Patent Application No. 201410748651.9 filed on Dec. 9, 2014, the disclosure of which is incorporated herein by reference in its entirety as part of the present application.

What is claimed is:

1. A detecting method for an array substrate comprising a plurality of signal lines and a repairing line intersecting with and isolated from the signal lines, the detecting method comprising:
applying a first detection signal to the plurality of signal lines; and
applying a second detection signal different from the first detection signal to the repairing line,
wherein the applying the first detection signal to the plurality of signal lines and the applying the second detection signal different from the first detection signal to the repairing line are performed simultaneously.

2. The detecting method according to claim 1, wherein, the first detection signal and the second detection signal are both constant voltage signals, or the first detection signal and the second detection signal are both constant current signals.

3. The detecting method according to claim 1, wherein, an absolute value of a difference value of the first detection signal and the second detection signal is greater than or equal to 20% of an absolute value of the first detection signal.

4. The detecting method according to claim 1, further comprising: providing a switch element and a detecting line in connection with the plurality of signal lines, such that the second detection signal is applied to the repairing line under control of the switch element.

5. The detecting method according to claim 4, wherein, the switch element is a switch transistor comprising a control terminal, an input terminal and an output terminal, the control terminal of the switch transistor is electrically connected to the detecting line, the output terminal of the switch transistor is electrically connected to the repairing line, and the input terminal of the switch transistor is electrically connected to a signal providing terminal.

6. The detecting method according to claim 5, wherein, the switch transistor is a bipolar transistor or a field effect transistor.

7. The detecting method according to claim 6, wherein, the switch transistor is a thin film field effect transistor formed on the array substrate.

8. The detecting method according to claim 1, wherein, the signal lines are data lines or gate lines.

9. The detecting method according to claim 4, wherein, the array substrate includes a display region for displaying and a peripheral region surrounding the display region, and the switch element is arranged in the peripheral region of the array substrate.

10. The detecting method according to claim 1, wherein, the array substrate includes a display region for displaying and a peripheral region surrounding the display region, and the repairing line is arranged in the peripheral region of the array substrate.

11. The detecting method according to claim 10, wherein, the repairing line has an annular shape.

12. The detecting method according to claim 1, wherein, the first detection signal and the second detection signal are constant voltage signals opposite in polarity.

13. The detecting method according to claim 12, wherein, the first detection signal is 15V, and the second detection signal is −20V.

14. An array substrate comprising a plurality of signal lines and a repairing line intersecting with and isolated from the signal lines, a detecting line in connection with the plurality of signal lines, a switch element and a signal providing terminal, wherein the switch element has an input terminal in electrical connection with the signal providing terminal, an output terminal in electrical connection with the repairing line and a control terminal in electrical connection with the plurality of signal lines through the detecting line.

15. The array substrate according to claim 14, wherein, the switch element is a bipolar transistor or a field effect transistor.

16. The array substrate according to claim 14, wherein, the switch element is a thin film field effect transistor formed on the array substrate.

17. The array substrate according to claim 14, wherein, the signal lines are data lines or gate lines.

18. The array substrate according to claim 14, wherein, the array substrate includes a display region for displaying and a peripheral region surrounding the display region, and the switch element and the repairing line are arranged in the peripheral region of the array substrate.

19. The array substrate according to claim 18, wherein, the repairing line has an annular shape.

* * * * *